(12) United States Patent
Chen et al.

(10) Patent No.: US 12,629,761 B2
(45) Date of Patent: May 19, 2026

(54) ANNULAR STRUCTURE FOR AN ELECTRONIC FLAME OFF WAND

(71) Applicant: Sandisk Technologies, Inc., Milpitas, CA (US)

(72) Inventors: Jingyun Chen, Shanghai (CN); Lian Chen, Shanghai (CN); Guangqiang Li, Shanghai (CN); Pengchen Ai, Shanghai (CN); Yuanheng Zhang, Shanghai (CN); Huijie Zhu, Shanghai (CN); Wenbin Qu, Shanghai (CN); Yonglong Liu, Shanghai (CN); Xiaoting Guo, Shanghai (CN); Guiyang Jiang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 160 days.

(21) Appl. No.: 18/348,483

(22) Filed: Jul. 7, 2023

(65) Prior Publication Data

US 2025/0015040 A1    Jan. 9, 2025

(51) Int. Cl.
| | |
|---|---|
| *B23K 20/00* | (2006.01) |
| *B23K 1/00* | (2006.01) |
| *B23K 3/02* | (2006.01) |
| *H10W 72/00* | (2026.01) |

(52) U.S. Cl.
CPC ............ *B23K 1/0016* (2013.01); *B23K 3/021* (2013.01); *B23K 20/00* (2013.01); *H10W 72/01551* (2026.01); *H10W 72/07141* (2026.01); *H10W 72/07511* (2026.01)

(58) Field of Classification Search
CPC .. B23K 20/007; B23K 20/005; B23K 20/004; B23K 20/10; H01L 24/78; H01L 2224/85045
See application file for complete search history.

(56) References Cited

U.S. PATENT DOCUMENTS

| | | | | |
|---|---|---|---|---|
| 2,969,479 A * | 1/1961 | Lawson | .............. | G01R 19/155 |
| | | | | 315/39 |
| 4,594,493 A * | 6/1986 | Harrah | .................... | H01L 24/78 |
| | | | | 219/56.22 |
| 6,110,823 A * | 8/2000 | Eldridge | ................. | H01L 24/12 |
| | | | | 257/E21.507 |
| 6,180,891 B1 * | 1/2001 | Murdeshwar | ........... | H01L 24/85 |
| | | | | 361/776 |
| 6,234,376 B1 * | 5/2001 | Wicen | .................. | B23K 20/007 |
| | | | | 219/56.22 |
| 6,267,290 B1 * | 7/2001 | Murdeshwar | ........... | H01L 24/78 |
| | | | | 228/110.1 |
| 6,784,394 B2 * | 8/2004 | Nishiura | ................. | H01L 24/78 |
| | | | | 219/56.22 |

(Continued)

*Primary Examiner* — Erin B Saad
(74) *Attorney, Agent, or Firm* — DENTONS Durham Jones Pinegar

(57) ABSTRACT

An annular structure for an electronic flame off (EFO) wand of a wire bonder is positioned beneath a capillary of the wire bonder. The annular structure provides uniform heat to a bond wire extending from the capillary to form a free air ball (FAB). Because heat is uniformly applied to the bond wire, the FAB is uniformly formed and is centered with respect to the capillary. The FAB is then bonded to a bond pad of a substrate. Because the FAB was uniformly formed and is centered on the capillary, the FAB will also be centered on the bond pad.

20 Claims, 6 Drawing Sheets

(56)  References Cited

U.S. PATENT DOCUMENTS

| | | | | |
|---|---|---|---|---|
| 7,918,378 B1 * | 4/2011 | Pham | | H01L 24/78 |
| | | | | 228/904 |
| 8,066,170 B2 * | 11/2011 | Gillotti | | H01L 24/78 |
| | | | | 228/180.5 |
| 9,044,821 B2 * | 6/2015 | Maeda | | H01L 24/78 |
| 9,165,904 B1 * | 10/2015 | Siong | | B23K 20/007 |
| 9,362,251 B2 * | 6/2016 | Sakakura | | H01L 24/78 |
| 2005/0199677 A1 * | 9/2005 | Sadler | | H01L 24/78 |
| | | | | 228/4.5 |
| 2005/0260791 A1 * | 11/2005 | Beatson | | H01L 21/486 |
| | | | | 257/E23.024 |
| 2008/0035709 A1 * | 2/2008 | Nishiura | | B23K 20/007 |
| | | | | 228/176 |
| 2008/0099531 A1 * | 5/2008 | Wong | | B23K 20/004 |
| | | | | 228/42 |
| 2011/0049219 A1 * | 3/2011 | Huang | | B23K 20/007 |
| | | | | 228/42 |
| 2011/0277861 A1 * | 11/2011 | Liu | | H01L 24/78 |
| | | | | 137/583 |
| 2012/0145770 A1 * | 6/2012 | Song | | B23K 20/004 |
| | | | | 228/42 |
| 2015/0235981 A1 * | 8/2015 | Eu | | H01L 24/78 |
| | | | | 257/784 |
| 2017/0190002 A1 * | 7/2017 | Yoshida | | H01L 24/01 |
| 2019/0058312 A1 * | 2/2019 | Meinhold | | H01B 11/1895 |
| 2025/0015040 A1 * | 1/2025 | Chen | | H01L 24/78 |

* cited by examiner

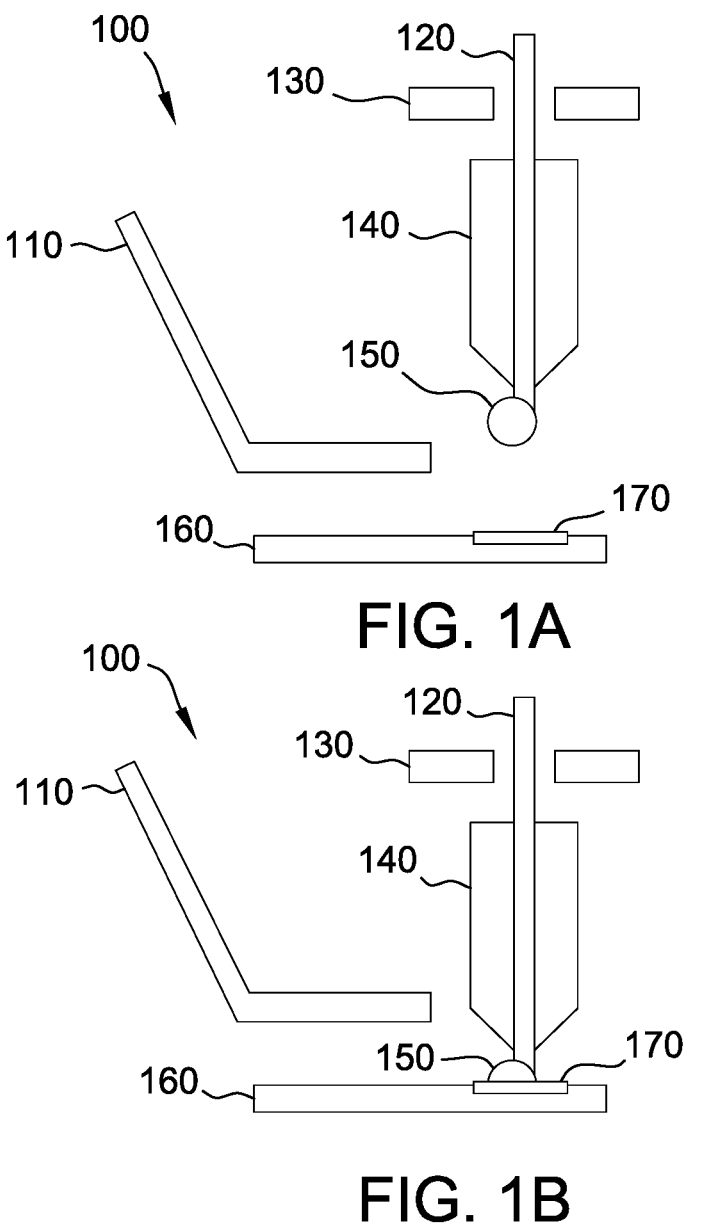
FIG. 1A
FIG. 1B
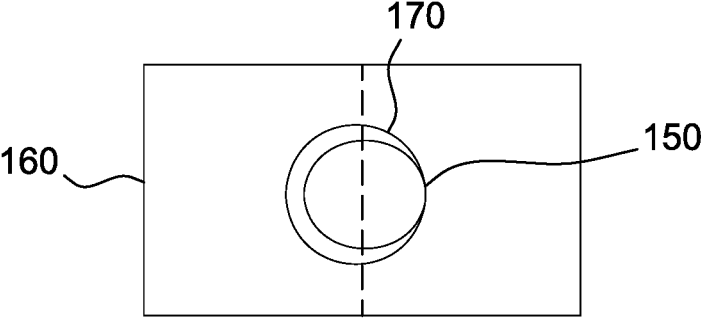
FIG. 1C

400

410

460

470

440

480

430

420

490

495

500

510

520

ANNULAR STRUCTURE FOR AN ELECTRONIC FLAME OFF WAND

BACKGROUND

Wire bonding is a process whereby electrical connections are established between a semiconductor die or an integrated circuit and a bond pad on a circuit board or a substrate. During the wire bonding process, an electronic flame off (EFO) wand is positioned near a bond wire that extends from a capillary of a wire bonding machine. An electric current is provided to the EFO wand and a spark is created between the bond wire and the EFO wand. The spark generates heat, which melts at least a portion of the bond wire, and a free air ball (FAB) is formed. The FAB is coupled to the bond pad using thermosonic energy.

As semiconductor packages get smaller, a size of a bond pad opening and/or the bond pad decreases. As a result, a size of the FAB must also decrease. However, as the size of the FAB decreases, the greater the chance that the FAB will be offset from the center of the capillary during/after formation.

For example, when the spark is created between the EFO wand and the bond wire, a portion of the bond wire nearest the EFO wand gains more energy than other portions of the bond wire. As a result, the FAB is offset from the center of the capillary. When the FAB is subsequently coupled to the bond pad, the FAB is tilted to one side, which reduces the reliability of the connection.

Accordingly, it would be beneficial to reduce or prevent the formation of offset FABs during a wire bonding process.

SUMMARY

The present application describes an annular structure for use with a wire bonding process. In an example, the annular structure is part of, or is otherwise associated with, an electronic flame off (EFO) wand of a wire bonder (or a wire bonding machine). The annular structure uniformly provides energy or heat to a bond wire when creating a free air ball (FAB) during a wire bonding process. For example, the annular structure is positioned directly below the bond wire. When energy or heat is emitted from the annular structure, the FAB is formed. However, because the heat/energy is uniformly applied to the bond wire, the FAB is uniformly formed and/or is centered with respect to a capillary from which the bond wire extends.

Accordingly, the present application describes a wire bonder that includes a capillary defining an aperture. In an example, when the wire bonder performs wire bonding, a bond wire extends from the aperture. The wire bonder also includes an electronic flame off (EFO) wand for heating the bond wire. A structure is provided on a distal end of the EFO wand. In an example, the structure is positioned below the capillary and is adapted to uniformly provide heat to at least a portion of the bond wire to form a free air ball (FAB).

In another example, a method for forming a FAB is described. In an example, the method includes extending a bond wire from a capillary associated with a wire bonder. Heat is emitted from an annular structure disposed beneath the capillary to form the FAB on at least a portion of the bond wire. In an example, the annular structure is provided on a distal end of an electronic flame off (EFO) wand.

In another example, an Electronic Flame Off (EFO) wand for a wire bonder is described. In an example, the EFO wand includes an annular heating means positioned beneath a capillary of the wire bonder. The annular heating means is adapted to uniformly provide heat to at least a portion of a bond wire extending from the capillary to form a free air ball (FAB).

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 1A-FIG. 1C illustrate an existing electronic flame off (EFO) wand for a wire bonder.

DETAILED DESCRIPTION

Figure 2:
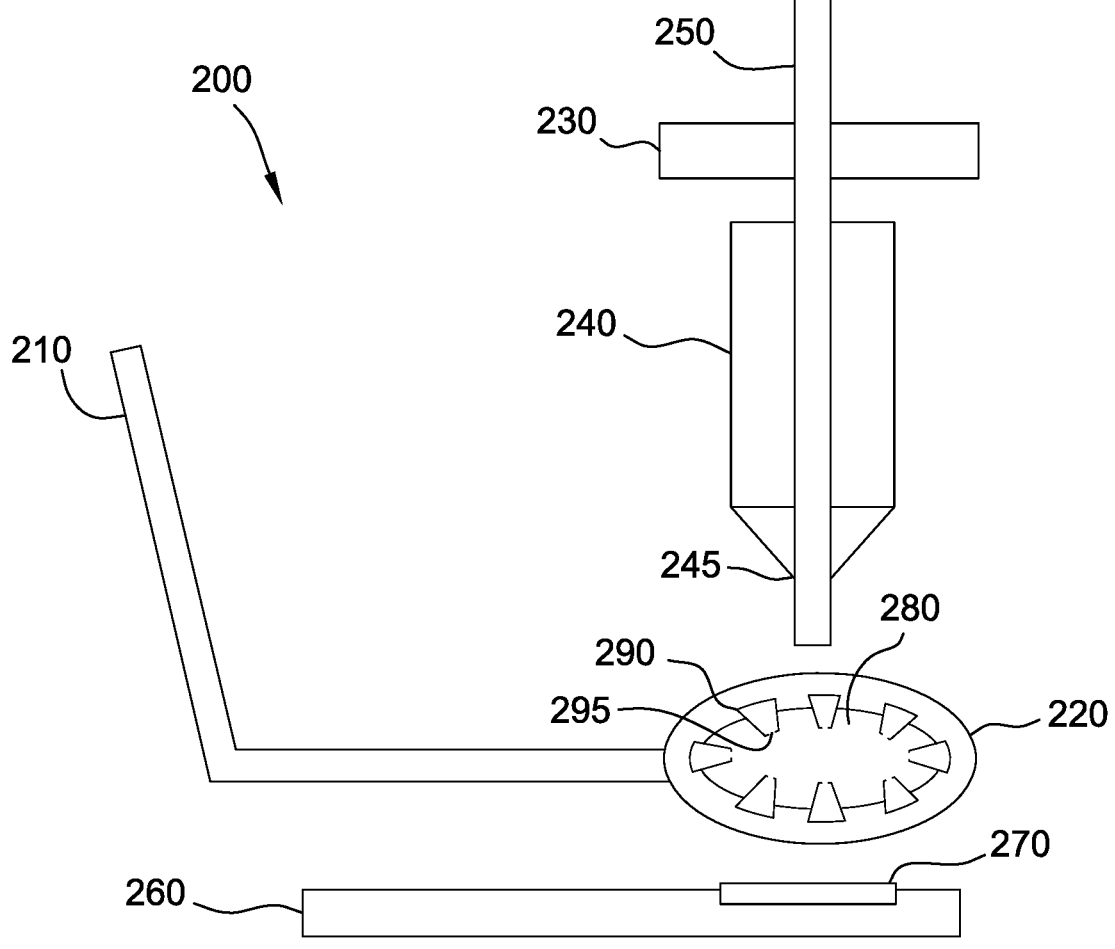
FIG. 2 illustrates an EFO wand having an annular structure according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

During a wire bonding process, an electronic flame off (EFO) wand is positioned near a bond wire that extends from a capillary of a wire bonder. An electric current is provided to the EFO wand and a spark is generated between the bond wire and the EFO wand. The spark generates heat, which softens or melts a tail of the bond wire and a free air ball (FAB) is formed. The FAB may then be coupled to a bond pad (through a bond pad opening) on a package or a substrate.

However, as semiconductor packages get smaller, the size of a bond pad and/or the size of the bond pad opening decreases. As a result, a size of the FAB may also decrease. As the size of the FAB decreases, it is more likely that the FAB will be offset (e.g., from the center of the capillary) during formation.

Typically, the offset occurs because the portion of the bond wire nearest the EFO wand gains more energy. As a result, the FAB moves toward one side of the capillary. When the FAB is coupled to the bond pad, the FAB is typically tilted to that side, which reduces the reliability of the connection.

In order to address the above, the present application describes an annular structure for an EFO wand of a wire bonder (or a wire bonding machine). In an example, the annular structure provides uniform energy or uniform heat to a bond wire (e.g., energy/heat is uniformly applied to all portions of a tail, or another portion, of the bond wire) during the formation of the FAB.

For example, during a wire bonding process, the annular structure is positioned directly below the bond wire and/or a capillary of the wire bonder. When energy or heat (e.g., in the form of a spark, or generated by the spark) is emitted from the annular structure, the bond wire melts or becomes a molten material. Surface tension of the molten material causes the FAB to be formed. However, because the heat/ energy is uniformly applied to the bond wire, the FAB is uniformly formed. For example, the FAB is centered (or is not offset) with respect to the capillary from which the bond wire extends.

Accordingly, many technical benefits may be realized including, but not limited to, forming optimized FABs during a wire bonding process, decreasing the chance that off-centered bonds will be formed on bond pads, and increasing the reliability of the bond wire and a semiconductor device on which the wire bonding process was performed.

These and other examples will be shown and described in greater detail with respect to FIG. 1-FIG. 5.

FIG. 1A-FIG. 1C illustrate an existing electronic flame off (EFO) wand 110 for a wire bonder 100. In the example shown in FIG. 1A, the wire bonder 100 also includes a wire clamp 130 and a capillary 140.

In an example, the wire clamp 130 prevents a bond wire 120 from shifting or moving during a wire bonding process. The capillary 140 guides the bond wire 120 to a particular location on a bond pad 170 of a substrate 160.

During the wire bonding process, a portion of the bond wire 120 extends from the capillary 140. An electric current is provided to the EFO wand 110 and a spark is generated between the EFO wand 110 and the bond wire 120. The spark generates heat, which causes a tail of the bond wire 120 to melt. Surface tension of the molten metal causes a free air ball (FAB) 150 to be formed.

However, as shown in FIG. 1A, the FAB 150 is offset from a center of the bond wire 120 and/or the capillary 140. As previously discussed, this issue typically occurs because a portion of the bond wire 120 nearest the EFO wand 110 gains more energy when compared to the other sides/ portions of the bond wire 120. As a result, the FAB 150 moves to one side or is otherwise not centered on the capillary 140.

As shown in FIG. 1B, when the capillary 140 couples, or bonds, the FAB 150 to the bond pad 170 of the substrate 160, the FAB 150 is tilted to one side. As a result, the FAB 150 may also be offset or otherwise not centered on the bond pad 170. This is also shown in FIG. 1C.

For example, FIG. 1C is a top-down view of the FAB 150 on the bond pad 170. As shown, the FAB 150 is offset from, or is otherwise not centered on, the bond pad 170.

FIG. 2 illustrates an EFO wand 210 having an annular structure 220 according to an example. In the example shown, the annular structure 200 is an annular ring. Although an annular ring is specifically shown and described, the annular structure 220 may have any annular shape.

The EFO wand 210 and the annular structure 220 may be included, or otherwise be associated with, a wire bonder 200. In an example, the wire bonder 200 also includes a wire clamp 230 and a capillary 240. A bond wire 250 extends through the wire clamp 230 and the capillary 240. In an example, the wire clamp 230 prevents the bond wire 250 from shifting or moving during a wire bonding process. The capillary 240 may be used to guide the bond wire 250 to a particular location on a bond pad 270 of a substrate 260.

In an example, the annular structure 220 extends from a distal end of the EFO wand 210. The annular structure 220 may have, or may define, an aperture 280. The aperture 280 defines a diameter. Likewise, the annular structure 220 may also define a diameter. In an example, the diameter of the aperture 280 and/or the diameter of the annular structure 220 is larger than a diameter of the capillary 240. As such, and as will be described in greater detail herein, when a FAB is formed, the capillary 240 moves from a first position, through/within the aperture 280, to a second position, when placing or bonding the FAB to the bond pad 270.

The annular structure 220 may also include one or more tines 290. In an example, each of the one or more tines 290 extend from an inner surface of the annular structure 220. For example, the one or more tines 290 may extend from the inner surface of the annular structure 220 into the aperture 280. In one example, one or more of the tines 290 may be perpendicular or substantially perpendicular to the inner surface of the annular structure 220. In another example, one or more of the tines 290 may be positioned at an angle (e.g., angled up or angled down) with respect to the inner surface of the annular structure 220.

One or more of the tines 290 may also define, or otherwise include, an aperture 295. The aperture 295 in each of the one or more tines 290 may provide an outlet for an electric current, a spark, and/or heat that is generated by, or is otherwise associated with, the annular structure 220 during a wire bonding process.

As will be shown and described in greater detail herein with respect to FIG. 3A-FIG. 3E, the annular structure 220 reduces the chances or prevents a FAB from being offset when the FAB is formed during a wire bonding process. For example, during the wire bonding process, the annular structure 220 is positioned below the capillary 240. In an example, a center axis of the annular structure 220 is positioned below a center axis of the capillary 240 (or a center axis of an aperture 245 of the capillary 240). When at least a portion (e.g., a tail) of the bond wire 250 extends from the aperture 245 of the capillary 240, the annular structure 220 provides uniform heat/energy to the portion of the bond wire 250 to form the FAB.

In an example, when the annular structure 220 is positioned below the capillary 240, an electric current is provided to the annular structure 220 via the EFO wand 210. The electric current may be used to form a spark between the annular structure 220, the tines 290 and/or the bond wire 250. The spark generates energy and/or heat. The energy and/or heat emanates or is emitted from the annular structure 220 which causes the portion of the bond wire 250 to melt. Surface tension associated with the molten bond wire 250 causes a FAB to form. However, due to the shape of the annular structure 220, the energy/heat emitted from the annular structure 220 is uniformly applied to the bond wire 250. As a result, an optimized FAB (e.g., a FAB that is not offset from the capillary 240) is formed.

FIG. 3A-FIG. 3E illustrate a process for forming a FAB during a wire bonding process according to an example. In an example, the FAB may be formed using an EFO wand and an annular structure such as, for example, the EFO wand 210 and the annular structure 220 shown and described with respect to FIG. 2. As such, and for reference purposes, similar reference numbers will be used in the description associated with FIG. 3A-FIG. 3E.

Figure 3A:
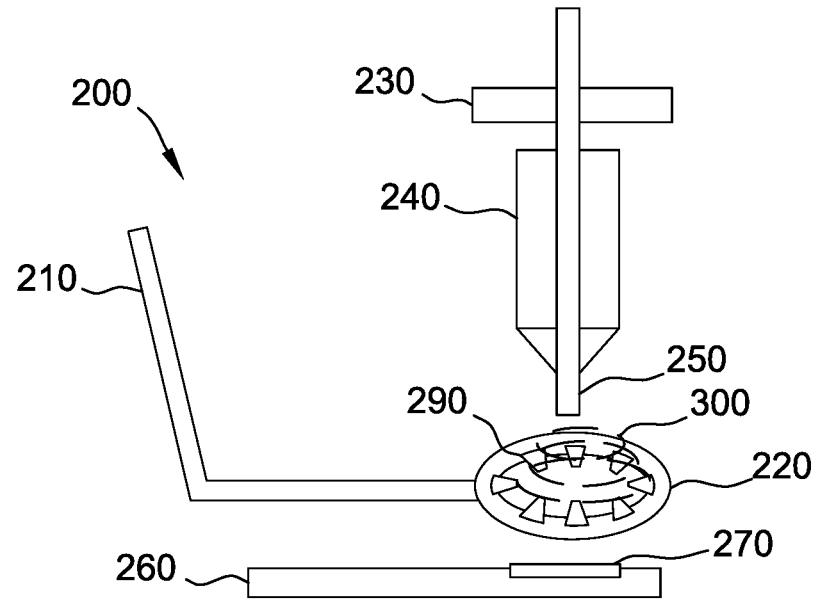
FIG. 3A-FIG. 3E illustrate a process for forming a free air ball (FAB) during a wire bonding process according to an example.

As shown in FIG. 3A, the annular structure 220 is adapted to generate annular energy (represented by the dashed rings 300). In an example, the term "annular energy" means energy or heat that emanates from, or is emitted by, the annular structure 220. The annular energy may be generated by an electric current that is applied to (or by), or is otherwise associated with, the EFO wand 210. In another example, the energy or heat that emanates from, or is emitted by, the annular structure 220 may be the result of a spark that is formed between the bond wire 250, the one or more tines 290 and/or the annular structure 220 when an electric current is applied to, or is otherwise associated with, the EFO wand 210.

Figure 3B:
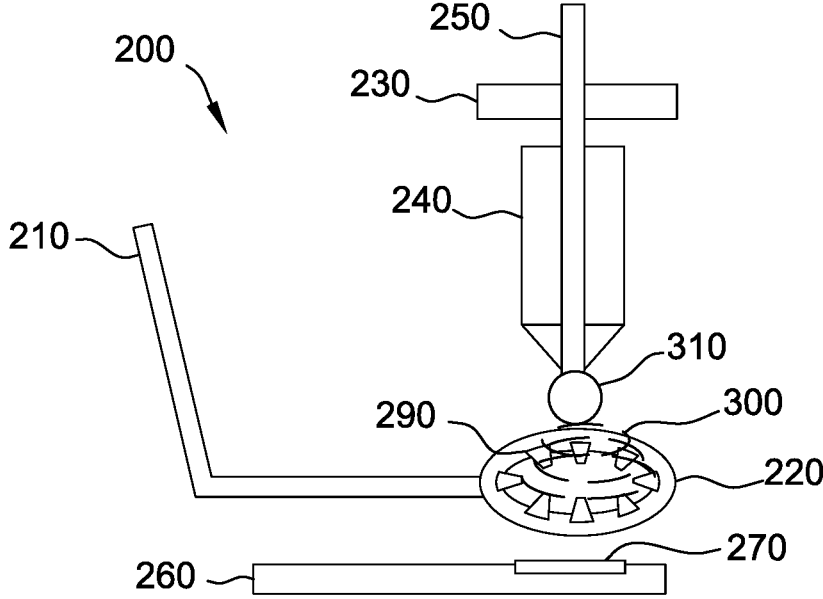

As shown in FIG. 3B, when the annular energy 300 has been generated, the annular energy 300 causes at least a portion of the bond wire 250 to a form a free air ball (FAB) 310. As previously indicated, due to the shape and/or position of the annular structure 220 with respect to the capillary 240 and/or the bond wire 250, the FAB 310 is not offset from the capillary 240 as is the FAB 150 shown in FIG. 1A.

Figure 3C:
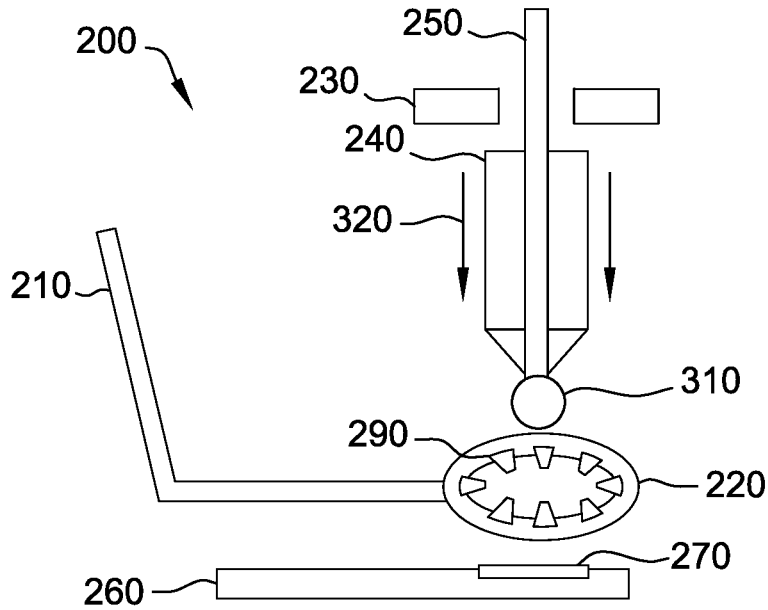
Figure 3D:
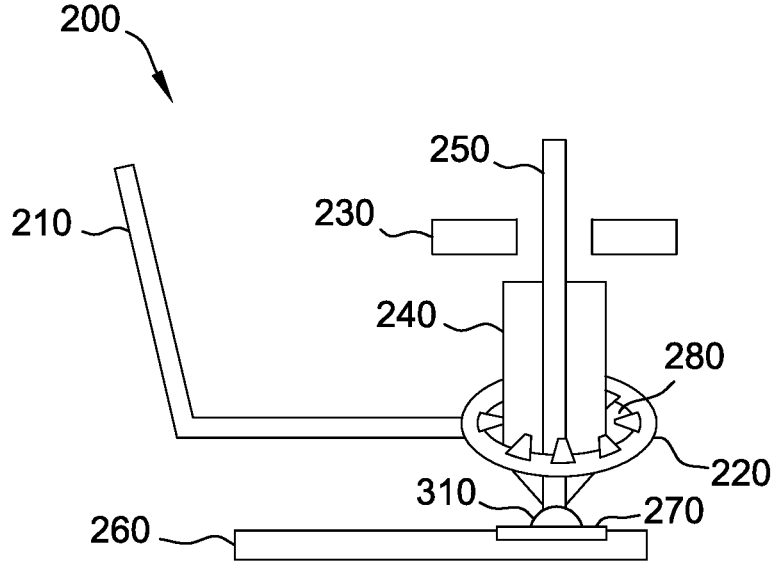
Figure 3E:
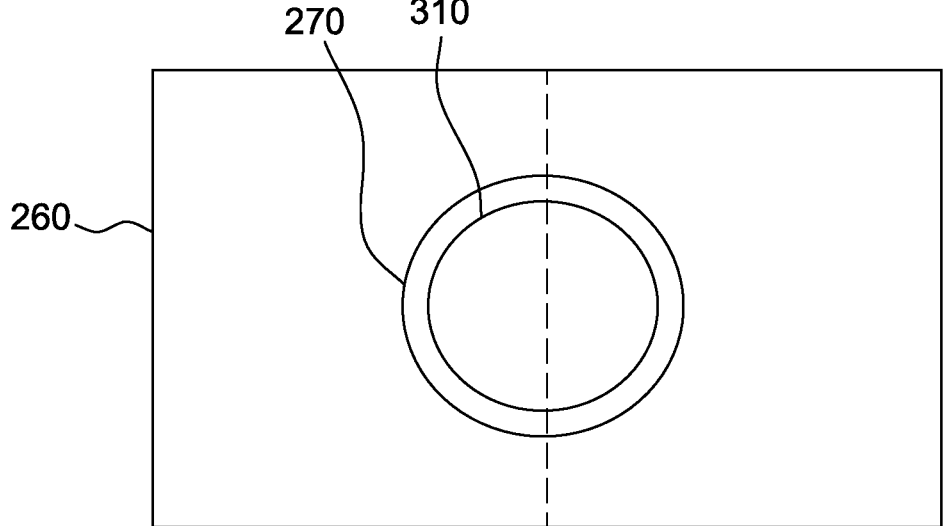

Referring to FIG. 3C, when the FAB 310 has been formed, the wire bonder 200 causes the capillary 240 to move from a first position to a second position in the direction of the arrows 320. As shown in FIG. 3D, the diameter of annular structure 220 is larger than the diameter of capillary 240, as such, the capillary 240 moves through/within the aperture 280 defined by the annular structure 220. The capillary 240 may then bond or otherwise place the FAB 310 on the bond pad 270 of the substrate 260. Because the FAB 310 was not offset when formed, the FAB 310 is not offset on the bond pad 270. For example, and as shown in FIG. 3E, the FAB 310 is centered, or substantially centered, on the bond pad 270.

Figure 4:
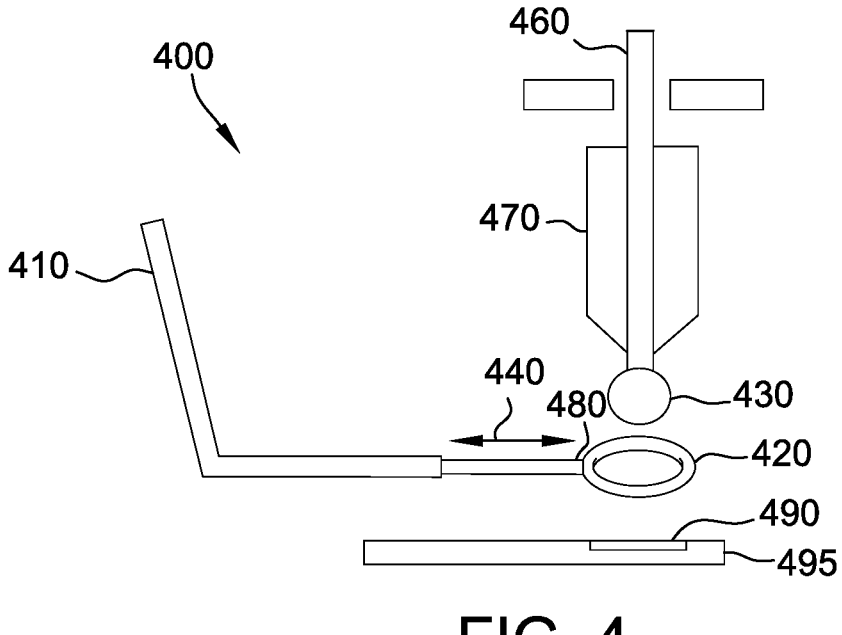
FIG. 4 illustrates an annular structure for an EFO wand according to an example.

FIG. 4 illustrates an annular structure 420 for an EFO wand 410 according to an example. In this example, the EFO wand 410 and the annular structure 420 may be part of a wire bonder 400. Additionally, the EFO wand 410 and the annular structure 420 may be similar to the EFO wand 210 and the annular structure 220 shown and described with respect to FIG. 2.

However, in this example, the annular structure 420 and/or the EFO wand 410 are moveable in one or more directions. For example, the annular structure 420 may move laterally (e.g., in the direction of arrows 440) between a first position and a second position. In an example, the diameter of annular structure 420 may be smaller than a diameter of a capillary 470. Thus, after the FAB 430 is formed, the EFO wand 210 move from an extended position to a retracted position, to enable the capillary 470 to move downward and place the FAB 430 on the bond pad 490 of the substrate.

For example, prior to forming a FAB 430, the annular structure 420 may be proximate to a distal end of the EFO wand 410. An arm 480 may be extendable from (and retractable to) the EFO wand 410. When the FAB 430 is to be formed, the arm 480 may move the annular structure 420 from a first position (e.g., proximate a distal end of the EFO wand 410) to a second position (e.g., beneath a capillary 470 of the wire bonder 400). Once positioned, the annular structure 420 may emit heat such as previously described. In response, at least a portion of the bond wire 460 melts to form the FAB 430.

Once the FAB 430 is formed, the arm 480 may at least partially retract toward the EFO wand 410. The capillary 470 may then move from a first position to a second position (e.g., toward a bond pad 490 of a substrate 495) and secure the FAB 430 to the bond pad 490 such as previously described.

In an example, when the capillary 470 moves from the first position to the second position (e.g., when bonding the FAB 430 to the bond pad 490), the capillary 470 may move within or through an aperture defined by the annular structure 420 such as previously described. In an example, the annular structure 420 may also move with the capillary 470.

For example, the annular structure 420 may move in the same direction, or in an opposite direction, as the capillary 470 when the capillary 470 attaches the bond wire 460 to the bond pad. In examples in which the capillary 470 moves laterally (e.g., to attach the bond wire 460 to another bond pad), the annular structure 420 may also move laterally. As such, the annular structure 420 and the capillary 470 may move together. Once the bond wire 460 has been coupled to another bond pad, the capillary 470 may withdraw from the aperture of the annular structure 420.

Figure 5:
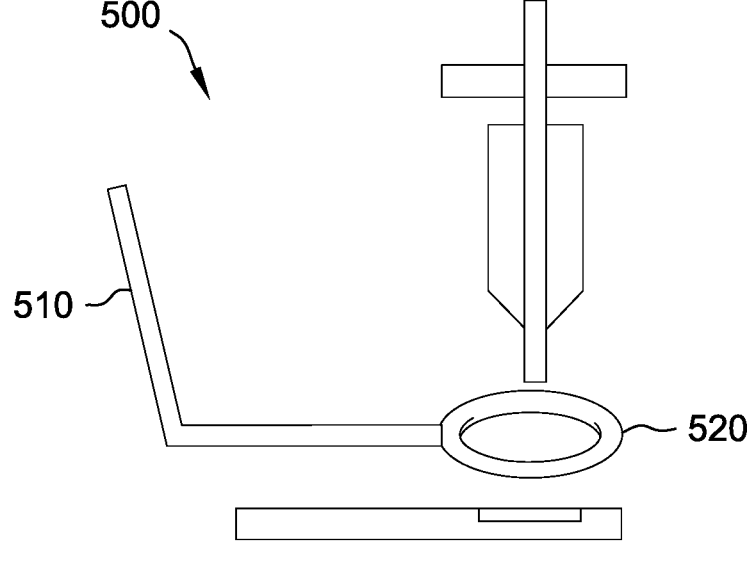
FIG. 5 illustrates an annular structure for an EFO wand according to another example.

FIG. 5 illustrates an annular structure 520 for an EFO wand 510 according to another example. In this example, the annular structure 520 and the EFO wand 510 may be part of a wire bonder 500. Additionally, the annular structure and/or the EFO wand 510 may be similar to the annular structure 220 and/or the EFO wand 210 shown and described with respect to FIG. 2. However, in this example, the annular structure 520 does not include tines. Although tines are not included, one or more apertures may be provided or otherwise formed on an inner surface of the annular structure 520.

Although an annular structure (e.g., an annular ring) is described, the structure may have any shape and/or dimensions. In some examples, the annular structure described herein may be removably attached to an EFO wand of a wire bonder.

Accordingly, examples of the present disclosure describe a wire bonder, comprising a capillary defining an aperture, wherein when performing wire bonding, a bond wire extends from the aperture; an electronic flame off (EFO) wand for heating the bond wire; and a structure provided on a distal end of the EFO wand, the structure positioned below the capillary and adapted to uniformly provide heat to at least a portion of the bond wire to form a free air ball (FAB). In an example, the structure is an annular structure. In an example, the wire bonder also includes a plurality of tines extending from an inner surface of the annular structure. In an example, at least one of the plurality of tines define an aperture. In an example, the structure has a first diameter and the capillary has a second diameter that is smaller than the first diameter. In an example, the capillary moves from a first position, through an aperture defined by the structure, to a second position to place the FAB on a bond pad. In an example, the structure is laterally moveable between a first position and a second position.

The present application also describes a method of forming a Free Air Ball (FAB), comprising: extending a bond wire from a capillary associated with a wire bonder; emitting heat from an annular structure disposed beneath the capillary to form the FAB on at least a portion of the bond wire, the annular structure provided on a distal end of an electronic flame off (EFO) wand. In an example, the annular structure has a first diameter and the capillary has a second diameter that is smaller than the first diameter. In an example, the method also includes moving the capillary from a first position, through the annular structure, to a second position. In an example, the method also includes placing the FAB on a bond pad when the capillary moves to the second position. In an example, the annular structure includes a plurality of tines extending from an inner surface. In an example, at least one of the plurality of tines define an aperture. In an example, the method also includes moving the annular structure from beneath the capillary to a different position when the FAB is formed. In an example, the annular structure is an annular ring.

The present application also describes an Electronic Flame Off (EFO) wand for a wire bonder, the EFO wand comprising: an annular heating means positioned beneath a capillary of the wire bonder, the annular heating means adapted to uniformly provide heat to at least a portion of a bond wire extending from the capillary to form a free air ball (FAB). In an example, the annular heating means is positioned on a distal end of an electronic flame off (EFO) wand. In an example, the EFO wand also includes a plurality of tines extending from a surface of the annular heating means. In an example, each of the plurality of tines define an aperture. In an example, the capillary moves from a first position, through an aperture defined by the annular heating means, to a second position.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of:

A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A wire bonder, comprising:
a capillary having a first dimension and defining a capillary aperture, wherein when performing wire bonding, a bond wire extends from the capillary aperture;
an electronic flame off (EFO) wand for heating the bond wire; and
an annular structure extending from a distal end of the EFO wand, the annular structure having a plurality of tines extending from an inner surface and defining an aperture, the aperture having a second dimension that is greater than the first dimension, the annular structure positioned below the capillary while uniformly providing heat to at least a portion of the bond wire to form a free air ball (FAB), wherein the capillary moves between a first position in which the capillary is positioned above the aperture to a second position in which the capillary extends through the aperture.

2. The wire bonder of claim 1, wherein at least one of the plurality of tines includes a tine aperture.

3. The wire bonder of claim 1, wherein the capillary couples the FAB to a bond pad when the capillary is in the second position.

4. The wire bonder of claim 1, wherein the annular structure is laterally moveable between a first position and a second position.

5. A wire bonder, comprising:
a capillary defining an aperture, wherein when performing wire bonding, a bond wire extends from the aperture;
a heating means for heating the bond wire as the bond wire extends from the aperture; and
a structure provided on a distal end of the heating means, the structure laterally extendable and retractable between a first position and a second position, wherein when the structure is in the second position, the structure is positioned below the capillary and uniformly provides heat to at least a portion of the bond wire when forming a free air ball (FAB).

6. The wire bonder of claim 5, wherein the structure is an annular structure.

7. The wire bonder of claim 5, further comprising a plurality of tines extending from an inner surface of the structure.

8. The wire bonder of claim 7, wherein at least one of the plurality of tines includes an aperture.

9. The wire bonder of claim 5, wherein the structure has a first dimension and the capillary has a second dimension that is smaller than the first dimension.

10. The wire bonder of claim 9, wherein the capillary moves from a first capillary position, through an aperture defined by the structure, to a second capillary position to place the FAB on a bond pad.

11. A wire bonder, comprising:
a capillary for extruding a bond wire during a wire bonding process;
a heating device for heating the bond wire; and
an annular structure associated with the heating device and defining a plurality of apertures on an inner surface of the annular structure, the annular structure positioned below the capillary while uniformly emitting annular energy from the plurality of apertures to at least a portion of the bond wire to form a free air ball (FAB).

12. The wire bonder of claim 11, wherein the plurality of apertures are part of respective tines of a plurality of tines extending from the inner surface of the annular structure.

13. The wire bonder of claim 11, wherein the annular structure has a first diameter and the capillary has a second diameter that is smaller than the first diameter.

14. The wire bonder of claim 13, wherein the capillary moves from a first capillary position, through an aperture defined by the annular structure, to a second capillary position to place the FAB on a bond pad.

15. The wire bonder of claim 11, wherein the annular structure is laterally moveable between a first position and a second position.

16. The wire bonder of claim 15, wherein the annular structure is part of an arm that extends from the wire bonder and wherein the arm is laterally moveable between the first position and the second position.

17. The wire bonder of claim 14, wherein the capillary and the annular structure move together, from the second position, to a third position.

18. The wire bonder of claim 1, wherein the capillary includes a body portion having the first dimension and a tapered portion extending from the body portion, the tapered portion including the capillary aperture and having an increasingly smaller dimension from a first portion of the tapered portion to the capillary aperture and wherein the tapered portion and the body portion extend through the aperture.

19. The wire bonder of claim 1, wherein the annular structure is removably attached to the EFO wand.

20. The wire bonder of claim 1, wherein the heat is generated by a spark formed between the bond wire and at least one of the annular structure and the plurality of tines.

* * * * *